United States Patent [19]

Patterson

[11] 4,064,310

[45] Dec. 20, 1977

[54] CONDUCTOR COMPOSITIONS

[75] Inventor: Frank Knowles Patterson, Wilmington, Del.

[73] Assignee: E. I. Du Pont de Nemours and Company, Wilmington, Del.

[21] Appl. No.: 775,273

[22] Filed: Mar. 7, 1977

[51] Int. Cl.$^2$ .............................................. H01B 1/02
[52] U.S. Cl. .................................. 428/427; 428/901; 428/433; 252/513; 106/1.27
[58] Field of Search ................. 252/519, 513; 106/1; 428/433, 427, 901; 75/170

[56] References Cited

U.S. PATENT DOCUMENTS

| 3,929,674 | 12/1975 | Patterson | 106/1 X |
|---|---|---|---|
| 3,943,168 | 3/1976 | Patterson | 252/519 |

*Primary Examiner*—Benjamin R. Padgett
*Assistant Examiner*—E. Suzanne Parr

[57] ABSTRACT

Conductor compositions of finely divided $Ni_3B_{1-x}P_x$ wherein $x$ is the approximate range 0.05–0.6, dispersed in a vehicle, useful for producing sintered conductor patterns on a substrate. Glass powder may optionally be present. Also the resultant fired conductors.

10 Claims, No Drawings

CONDUCTOR COMPOSITIONS

BACKGROUND OF THE INVENTION

This invention relates to electronics, and more particularly, to compositions useful for producing conductor patterns adherent to substrates.

Conductor compositions which are applied to and fired on dielectric substrates (glass, glass-ceramic, and ceramic) usually comprise finely divided inorganic powders (e.g., metal particles and binder particles) and are commonly applied to substrates using so-called "thick film" techniques, as a dispersion of these inorganic powders in an inert liquid medium or vehicle. Upon firing or sintering of the printed film, the metallic component of the composition provides the functional (conductive) utility, while the inorganic binder (e.g., glass, $Bi_2O_3$, etc.) bonds the metal particles to one another and to the substrate. Thick film techniques are contrasted with thin film techniques which involve deposition of particles by evaporation or sputtering. Thick film techniques are generally discussed in "Handbook of Materials and Processes for Electronics," C. A. Harper, Editor, McGraw-Hill, N.Y. 1970, Chapter 12.

The most commonly used conductor compositions employ noble metals, especially gold, silver, platinum, palladium, and their mixtures, alloys, and compounds, since their relatively inert characteristics permit firing in air. Attempts at using dispersions of less expensive non-noble metals have often been confined to specialized uses or have required the great practical inconvenience and expense of firing in non-oxidizing atmospheres (nitrogen, nitrogen/hydrogen, hydrogen, argon, etc.).

There is a distinct commercial need for less expensive conductor compositions which can be fired in air to produce adherent low resistivity conductors on dielectric substrates, including microcircuit patterns, end terminations for capacitors, etc.

Present commercial practice in the manufacture of gas discharge display devices is to fire nickel powders in a reducing or inert (non-oxidizing) atmosphere at high temperatures (e.g., above 900° C.) on relatively expensive forsterite ($2MgO.SiO_2$) substrates. Nickel is used due to its low tendency to sputter under glow discharge. The use of inexpensive, mass-produced, high quality glass substrates such as soda lime glass substrates would be desirable. However, the use of soda lime glass substrates usually limits the firing temperature of conductors thereon to no more than 625° C., due to the deformation of soda lime glass at higher temperatures. Firing at 625° C. is possible when the glass is supported. Without a support, firing at or below 600° C. is better, to prevent deformation. At these low temperatures it is very difficult to obtain good metallic sintering of nickel; consequently, adherent low resistivity nickel conductors are difficult to make.

There is consequently the need for a nickel-based conductor which can be fired below 625° C. in making gas discharge display devices on soda lime glass substrates. It is further desirable that the compositions be fireable in air, rather than in more expensive atmospheres (inert or reducing atmospheres).

My U.S. Pat. No. 3,943,168 issued Mar. 9, 1976, discloses conductor compositions based on nickel boride ($Ni_3B$) and certain nickel boride/silicides. That patent is hereby incorporated by reference herein. It has been found that while $Ni_3B$ gave improved results over the art, further improvement was needed in oxidation resistance during firing. Some oxidation of boron of $Ni_3B$ to $B_2O_3$ begins as early in the firing cycle as 325° C., and the $B_2O_3$ can prevent complete burnout of vehicle components. Also, during firing at 600° C., nickel can begin to oxidize.

SUMMARY OF THE INVENTION

This invention provides a conductor composition which has enhanced stability against oxidation when fired in air, despite being based upon the less expensive base metals. The composition comprises a finely divided nickel material of the formula $Ni_3B_{1-x}P_x$, wherein $x$ is the approximate range 0.05–0.6, preferably 0.1–0.4, more preferably 0.1–0.2. The nickel material is dispersed in a conventional inert liquid vehicle. Optionally a glass powder may be present in the composition, to act as an inorganic binder. The weight ratio of nickel material to glass does not exceed 1/1.5. The proportion of inorganic powder (nickel material and, where present, inorganic binder) is a matter of choice, depending upon the desired viscosity, but normally there is 60–80% inorganic powder and 20–40% vehicle. The compositions may, of course, be modified by the addition of other materials not affecting their beneficial characteristics.

The present invention also involves dielectric substrates (e.g., ceramics, glass and glass ceramics) having fired (sintered) thereon and adherent thereto the compositions described above. Of course, the chemical nature of the fired product may be modified during firing. Such fired conductor patterns are useful in many areas of electronics, such as in gas discharge display devices, end terminations for capacitors, and microcircuit applications.

DETAILED DESCRIPTION OF THE INVENTION

The essential component of the compositions of this invention is the nickel material of the formula $Ni_3B_{1-x}P_x$, $x$ having been defined above. It is thought that through most of this compositional range, once the appropriate starting materials have been melted together, a single-phase material (perhaps a solid solution) is formed. X-ray data at $x$ of 0.05 and $x$ of 0.4 confirm this. It is possible that a second phase may be present at $x$ of about 0.6, but so long as the stated atomic ratios are placed into the batch and melted, the nickel material of this invention is present.

Such nickel materials have enhanced oxidative stability. Depending upon the particular nickel material employed, firing will be conducted at a temperature in the range 550°–950° C., in accordance with principles known to those skilled in the art to achieve desired results. At higher phosphorus contents, temperatures near 800° C. may be used to minimize resistance and avoid melting. Duration at peak firing temperature is at least 2 minutes, preferably at least 10 minutes.

Where gas discharge display devices are made on soda lime glass substrates, firing temperatures in the 550°–625° C. range will be used, preferably 550°–580° C.

The nickel materials of this invention can be made by heating appropriate relative quantities of starting materials (e.g., Ni, B, $Ni_2P$, $Ni_3B$, etc.) in an inert atmosphere (e.g., argon) to form a liquid, cooling and comminuting the resultant ingot sufficiently finely to pass through a 400-mesh screen. Dependent upon desired fired properties or firing conditions, further comminution may be desirable.

Any conventional electronic glass powder may be used as the inorganic binder in the compositions of the present invention, as known to those skilled in the art, including, for example, those of Larson and Short U.S. Pat. No. 2,822,279 (issued Feb. 4, 1958); Short U.S. Pat. No. 2,819,170 (issued Jan. 7, 1958); etc.

All the inorganic powders used herein are finely divided, i.e., pass through a 400-mesh screen. It is preferred that substantially all the particles have a largest dimension ("diameter") of 5 microns or less.

The inorganic particles are dispersed in an inert liquid vehicle by mechanical mixing (e.g., on a roll mill) to form a paste-like composition. The latter is printed as "thick film" on conventional dielectric substrates in the conventional manner. Any inert liquid may be used as the vehicle. Any of various organic liquids, with or without thickening and/or stabilizing agents and/or other common additives, may be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

After printing the dispersions on a substrate and drying to remove the vehicle, firing of the compositions of the present invention is carried out at temperatures and for times sufficient to sinter the inorganic materials and to produce conductor patterns adherent to the dielectric substrate, as discussed above. Firing is usually in air, but these compositions can also be fired in an inert atmosphere (nitrogen, argon) if desired.

EXAMPLES

The following examples and comparative showings illustrate the scope of the present invention. Here and elsewhere in the specification and claims, all parts, percentages, ratios, etc. are by weight unless otherwise stated. Of course, in the $Ni_3B_{1-x}P_x$ formula, atomic ratios are intended. All mesh sizes are U.S. standard sieve scale. All firings were in air.

PREPARATION OF NICKEL MATERIALS

The nickel materials of this invention were prepared by melting starting powder materials at 1,200°–1,400° C. in a high-purity alumina crucible in an atmosphere of purified argon. Heating was generally 100°–300° C. above the temperature at which the charge was entirely molten. Once the charge was molten, it was held at that temperature for about 10 minutes. Heating was by an induction furnace. The starting materials were varied but comprised the desired atomic ratios of Ni, B, and P. In some preparations the starting materials were Ni, B, and $Ni_2P$; in others, Ni, $Ni_3B$, and $Ni_2P$ were used. After the melting step, the charge cooled to an ingot, which was comminuted to a particle size such that the resultant powder passed through at least a 400-mesh screen.

OXIDATIVE STABILITY

Various experiments were performed to compare the oxidative stability of the nickel materials of this invention with that of $Ni_3B$. A weighed sample of either $Ni_3B$ or a nickel material of this invention was mixed with an equal weight of alumina powder (to maintain porosity and access to air), placed on an alumina substrate and plunged into an oven preheated to 800° C. After being held at 800° C. for 10 minutes, the weight gain for $Ni_3B$ was in excess of that calculated for complete oxidation of the boron in $Ni_3B$ to $B_2O_3$, indicating at least partial oxidation of Ni also. The increase in weight for the $Ni_3B_{1-x}P_x$ compounds of this invention was much less than that calculated for complete oxidation of the B content, indicating greater oxidative stability.

Other experiments were performed at 325° C., with similar enhanced stability found for the nickel materials of this invention. In one experiment, preweighed samples of $Ni_3B$ (0.78 m²/g) and $Ni_3B_{0.9}P_{0.1}$ (1.2 m²/g) were placed in alumina crucibles, and heated at 327° C. for 29.5 hours.

Percent weight gain was as follows:

|  | After Heating For | |
|---|---|---|
|  | 7 hr. | 29.5 hr. |
| $Ni_3B$ | 3.72% | 4.25% |
| $Ni_3B_{0.9}P_{0.1}$ | 0.24% | 0.21% |

This again confirmed the enhanced oxidative stability of the nickel materials of this invention.

PREPARATION OF FILMS

The nickel materials prepared as described above were dispersed in a vehicle of about 1 part ethyl cellulose and 9 parts terpineol. In some experiments glass was present, having the composition 78.1% PbO, 5.4% $SiO_2$, 12.4% $B_2O_3$ and 4.1% $Al_2O_3$. The ratio of inorganic solids (nickel material and glass, if any) to vehicle was about 70/30. The dispersions were printed through a 200-mesh patterned stainless steel screen as a 200-square serpentine conductor pattern (20 mils or 0.5 mm wide by 4 in. or 10.2 cm long) on dense alumina substrates. After being dried at 125° C. for 10 minutes, the printed substrates were fired at 325° C. for 10 minutes, and then plunged into a preheated box furnace at a temperature between 600° C. and 900° C. (as indicated in the Tables), and held at the stated temperature for 10 minutes. The resulting fired films were about 0.7 mil (15 microns) thick. The Tables report specific compositions used and resistivities found (milliohms/ square at 0.7 mil thickness). Resistivity was determined using a Triplett Model 8035 Type 1 Digital Volt/Ohmmeter.

In the Tables, "melted" means that the nickel material became fluid at the stated temperature, formed beads and was discontinuous, although conductive; "∞" means that the resistivity was infinite.

EXAMPLES 1–5; SHOWING A

In Table 1, films of compositions of this invention with various P contents were compared with films of $Ni_3B_{0.2}P_{0.8}$, not of this invention. No glass was used. There were 2.5 parts nickel material per part vehicle. Firing was conducted at four different temperatures. The resistivity found depends on the firing temperature and P content, each of which will be chosen depending upon the desired results. Thus, if a soda lime glass substrate is used, a firing temperature below 625° C. is necessary, where that glass softens. If a lower resistivity is desired, perhaps $Ni_3B_{0.9}P_{0.1}$ would be used. By contrast, $Ni_3B_{0.6}P_{0.4}$ would not be fired at 900° C. in air due to melting. $Ni_3B_{0.2}P_{0.8}$ is not of this invention due to its high P content and resultant performance.

TABLE 1

SHEET RESISTIVITIES (MILLIOHMS/SQ.) FOR GLASS-FREE COMPOSITIONS

| Example (No.) or Showing (Letter) | Nickel Component | Fired at (° C.) | | | |
|---|---|---|---|---|---|
| | | 600 | 700 | 800 | 900 |
| 1 | $Ni_3B_{0.95}P_{0.05}$ | 153 | 88 | 82 | 44 |
| 2 | $Ni_3B_{0.9}P_{0.1}$ | 229 | 103 | 82 | 46 |
| 3 | $Ni_3B_{0.8}P_{0.2}$ | 242 | 140 | 99 | melted |
| 4 | $Ni_3B_{0.6}P_{0.4}$ | 1,660 | 183 | 193 | melted |
| 5 | $Ni_3B_{0.4}P_{0.6}$ | ∞ | 9,260 | 540 | melted |
| A | $Ni_3B_{0.2}P_{0.8}$ | ∞ | ∞ | ∞ | ∞ |

EXAMPLES 6–10; SHOWING B

In Table 2 resistivities found using the same nickel materials as in Table 1, with glass added, are compared. There were 2.2 parts nickel material, 0.3 part glass and 1 part vehicle. Resistivity increased with increasing P content; $Ni_3B_{0.2}P_{0.8}$ produced useless films at each temperature. In Example 8, firing at 900° C. produced a darkened and somewhat oxidized film although the resistivity was useful.

TABLE 2

SHEET RESISTIVITIES (MILLIOHMS/SQ.) FOR GLASS-CONTAINING COMPOSITIONS

| Example (No.) or Showing (Letter) | Nickel Component | Fired at (° C) | | | |
|---|---|---|---|---|---|
| | | 600 | 700 | 800 | 900 |
| 6 | $Ni_3B_{0.95}P_{0.05}$ | 166 | 132 | 105 | 205 |
| 7 | $Ni_3B_{0.9}P_{0.1}$ | 176 | 123 | 106 | 387 |
| 8 | $Ni_3B_{0.8}P_{0.2}$ | 230 | 139 | 142 | 277 |
| 9 | $Ni_3B_{0.6}P_{0.4}$ | 298 | 165 | 167 | 126 |
| 10 | $Ni_3B_{0.4}P_{0.6}$ | 3,460 | 410 | 144 | melted |
| B | $Ni_3B_{0.2}P_{0.8}$ | ∞ | ∞ | ∞ | ∞ |

EXAMPLES 11–14; SHOWING C

Table 3 illustrates the useful ranges of glass content in the compositions of this invention. The same nickel material was used in each experiment ($Ni_3B_{0.9}P_{0.1}$, 2.7 m²/g). This was a much finer material than the 400-mesh nickel material used in Tables 1 and 2. The ratio of nickel material to glass is indicated in Table 3. In each experiment the dispersion contained 2.5 parts inorganic solids per part vehicle. From the above data, generally no more than 1.5 parts glass is used per part nickel material.

Table 3

SHEET RESISTIVITIES (MILLIOHMS/SQ.) FOR $Ni_3B_{0.9}P_{0.1}$/GLASS COMPOSITIONS

| Example (No.) or Showing (Letter) | Wt. $Ni_3B_{0.9}P_{0.1}$ | Wt. Glass | Fired at (° C.) | | | |
|---|---|---|---|---|---|---|
| | | | 600 | 700 | 800 | 900 |
| 11 | 2.2 | 0.3 | 107 | 47 | 32 | 102 |
| 12 | 2.0 | 0.5 | 113 | 55 | 35 | 240 |
| 13 | 1.25 | 1.25 | 354 | 74 | 420 | 196 |
| 14 | 1.00 | 1.50 | 528 | 61 | 38 | ∞ |
| C | 0.75 | 1.75 | ∞ | ∞ | ∞ | ∞ |

EXAMPLE 15

A sample of $Ni_3B_{0.9}P_{0.1}$ finer than the −400 mesh material of Example 2 was used to prepare films as above: 2.5 parts $Ni_3B_{0.9}P_{0.1}$ (1.1 m²/g) and 1.0 part vehicle were printed and fired as before and produced the following resistivities (milliohms/sq.) at the indicated peak firing temperatures: 600° C., infinite; 700° C., 93; 800° C., 60; and 900° C., 27. Thus, as would be expected by one skilled in the art, particle size affects rate of oxidation.

I claim:

1. Conductor compositions of finely divided inorganic powder dispersed in an inert liquid vehicle, wherein the inorganic powder is a material of the formula $$Ni_3B_{1-x}P_x,$$

wherein x is in the approximate range 0.05–0.6.

2. Compositions according to claim 1 wherein x is in the range 0.1–0.4.

3. Compositions according to claim 2 wherein x is in the range 0.1–0.2.

4. Compositions according to claim 1 additionally comprising finely divided glass as a binder, the weight ratio of $Ni_3B_{1-x}P_x$ to glass being no more than about 1/1.5.

5. Compositions according to claim 2 additionally comprising finely divided glass as a binder, the weight ratio of $Ni_3B_{1-x}P_x$ to glass being no more than about 1/1.5.

6. Compositions according to claim 3 additionally comprising finely divided glass as a binder, the weight ratio of $Ni_3B_{1-x}P_x$ to glass being no more than about 1/1.5.

7. A dielectric substrate having adherent thereto a sintered film of the composition of claim 1.

8. A dielectric substrate having adherent thereto a sintered film of the composition of claim 3.

9. A dielectric substrate having adherent thereto a sintered film of the composition of claim 4.

10. A dielectric substrate having adherent thereto a sintered film of the composition of claim 6.

* * * * *